United States Patent
Hsieh et al.

(10) Patent No.: US 12,113,266 B2
(45) Date of Patent: Oct. 8, 2024

(54) DUAL-BAND TRANSFORM CIRCUIT STRUCTURE

(71) Applicant: REALTEK SEMICONDUCTOR CORPORATION, Hsinchu (TW)

(72) Inventors: Tzu-Hao Hsieh, Hsinchu (TW); Chih-Chieh Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 254 days.

(21) Appl. No.: 17/930,175

(22) Filed: Sep. 7, 2022

(65) Prior Publication Data

US 2023/0071502 A1    Mar. 9, 2023

(30) Foreign Application Priority Data

Sep. 7, 2021   (TW) .................................. 110133273

(51) Int. Cl.
    H03H 7/42       (2006.01)
    H01P 5/10       (2006.01)
(52) U.S. Cl.
    CPC ............. H01P 5/1007 (2013.01); H03H 7/42 (2013.01)
(58) Field of Classification Search
    CPC .. H03H 7/42; H03H 7/422; H01P 5/10; H01P 5/1007
    USPC ..................................................... 333/25, 26
    See application file for complete search history.

(56) References Cited

U.S. PATENT DOCUMENTS

| 11,418,223 B2 * | 8/2022 | Hsieh ................... H04B 1/0057 |
| 2005/0237260 A1 * | 10/2005 | Bancroft ................. H01Q 9/285 |
| | | 343/859 |

FOREIGN PATENT DOCUMENTS

| CN | 107086339 B | 4/2019 |
| TW | 703819 B | 9/2020 |

OTHER PUBLICATIONS

Weng, R.-M., Cheng, S.-M., Hsiao, P.-Y., & Chang, Y.-H. (2008). An ultra-wide stopband lowpass filter using a cross-diapason-shaped defected ground structure. 2008 IEEE Topical Meeting on Silicon Monolithic Integrated Circuits in RF Systems. https://doi.org/10.1109/smic.2008.42.
Abdalla Abdulhadi Alsanousi Abdulhadi, Antumani Ashoka, and Wilson Jeberson, Combined Shaped Microstrip Line and DGS Techniques for Compact Low Pass Filter Design, International Journal of Engineering & Technologu IJET-UJENS, Jun. 2013, p. 74-77, vol. 13 No. 03.
English Abstract Translations of TWI703819B and CN107086339B.

* cited by examiner

Primary Examiner — Stephen E. Jones
(74) Attorney, Agent, or Firm — WPAT, P.C.; Anthony King

(57) ABSTRACT

A dual-band transform circuit structure includes a first transmission line, a second transmission line, and a conductive layer. The first transmission line has a first input terminal, a first output terminal, and a second output terminal. The second transmission line has a second input terminal, a third input terminal, a third output terminal, and a fourth output terminal. The second input terminal is coupled to the first output terminal, and the third input terminal is coupled to the second output terminal. The conductive layer is stacked with the first transmission and the second transmission line. The conductive layer includes a first hollow pattern. The first hollow pattern and the second transmission line are overlapped in a top view.

20 Claims, 4 Drawing Sheets

DUAL-BAND TRANSFORM CIRCUIT STRUCTURE

CROSS-REFERENCE TO RELATED APPLICATIONS

This application claims the benefit of priority to Patent Application No. 110133273, filed in Taiwan on Sep. 7, 2021, which is incorporated by reference in its entirety.

TECHNICAL FIELD

The present application relates to a wireless communication circuit structure, particularly to a dual-band transform circuit structure.

BACKGROUND

In wireless communication systems, the linearity of the power output stage is not satisfactory, which will generate more or less high-order harmonics at the output terminal and cause interference to other frequency bands. Therefore, how to suppress the high-order harmonics of the system within the specification, in order to improve the system performance and comply with the regulations, has become one of the issues in this field.

SUMMARY OF THE INVENTION

One aspect of the present application provides a dual-band transform circuit structure including a first transmission line, a second transmission line and a conductive layer. The first transmission line has a first input terminal, a first output terminal and a second output terminal. The second transmission line has a second input terminal, a third input terminal, a third output terminal and a fourth output terminal. The second input terminal is coupled to the first output terminal, and the third input terminal is coupled to the second output terminal. The conductive layer is stacked with the first transmission line and the second transmission line. The conductive layer includes a first hollow pattern. The first hollow pattern and the second transmission line are overlapped in a top view.

Another aspect of the present application provides a dual-band transform circuit structure including a first conductive layer and a second conductive layer. The second conductive layer includes a first hollow pattern. The second conductive layer and the first conductive layer are stacked and separated by a dielectric material. The first conductive layer includes a balun circuit, a filter circuit and a coplanar strip. The filter circuit includes a transmission line. The transmission line includes a second hollow pattern. The first hollow pattern and the transmission line are overlapped in a top view, and the first hollow pattern is not overlapped with the second hollow pattern in the top view. The filter circuit is coupled between the balun circuit and the coplanar strip.

The dual-band transform circuit structure of the present application provides higher insertion loss for at high-frequency by using the hollow pattern on the transmission line and the ground conductive layer. Compared with the conventional arts, the dual-band transform circuit structure of the present application does not use additional components, materials, and wiring area, and can improve the suppression of high-order harmonics.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
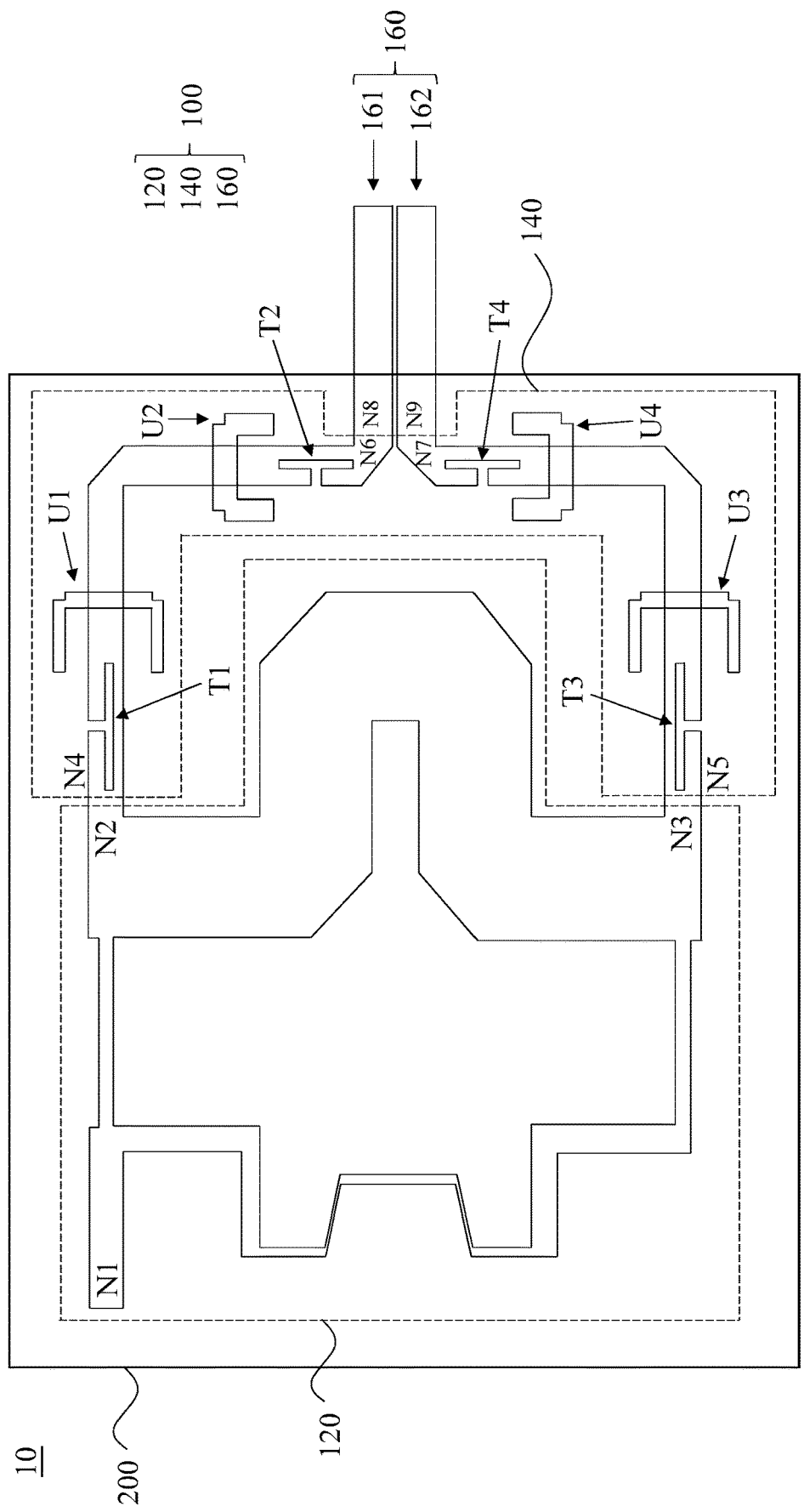
FIG. 1 is a schematic diagram illustrating a dual-band transform circuit structure in certain embodiments of the present disclosure.

The embodiments of the present disclosure improve the dual-band transform circuit used in dual-band wireless communication systems to increase the ability of the dual-band transform circuit to suppress harmonics, thereby reducing the high-order harmonics of the overall system. FIG. 1 is a schematic diagram of a dual-band transform circuit structure 10 of some embodiments of the present disclosure. The dual-band transform circuit structure 10 is configured to receive an input signal and generate a transformed signal to the power output stage (not shown in the drawings). The power output stage amplifies the transformed signal into an output signal according to a gain value. In some embodiments, the dual-band transform circuit structure 10 is used in a dual-band wireless communication transmitter, for example, in a transmitter that complies with IEEE 802.11 a/b/g/n/ac specifications.

The dual-band transform circuit structure 10 is disposed on a 2-layer printed circuit board. The 2-layer printed circuit includes a conductive layer 100 and a conductive layer 200, and the conductive layer 100 and the conductive layer 200 are stacked and separated by a dielectric material. The conductive layer 100 is disposed at the top of the 2-layer printed circuit board and includes a dual-band microstrip for receiving an input signal and performing signal processing, and the processed signal is then outputted via a coplanar strip 160. The conductive layer 200 is a reference ground layer and disposed at the bottom of the 2-layer printed circuit board. As shown in FIG. 1, the dual-band microstrip includes a balun circuit 120 (hereinafter, transmission line 120) and a filter circuit 140 (hereinafter, transmission line 140). In some further embodiments, the filter circuit 140 is a low-pass filter. The coplanar strip 160 (hereinafter, transmission line 160) includes a first strip 161 and a second strip 162.

An input terminal N1 of the transmission line 120 is configured to receive the input signal; an output terminal N2 and an output terminal N3 of the transmission line 120 are respectively connected to an input terminal N4 and an input terminal N5 of the transmission line 140; an output terminal N6 and an output terminal N7 of the transmission line 140 are respectively connected to an input terminal N8 of the first strip 161 and an input terminal N9 of the second strip 162. In a top view as shown in FIG. 1, the transmission line 120 and transmission line 140 are disposed within the area of the conductive layer 200, and are overlapped with the conductive layer 200. The left side of the transmission line 160 overlaps with the conductive layer 200, and the transmission line 160 extends beyond the area of the conductive layer 200 toward the right. Specifically, the first strip 161 and the first strip 162 extends in a direction away from the transmission line 140.

Figure 2:
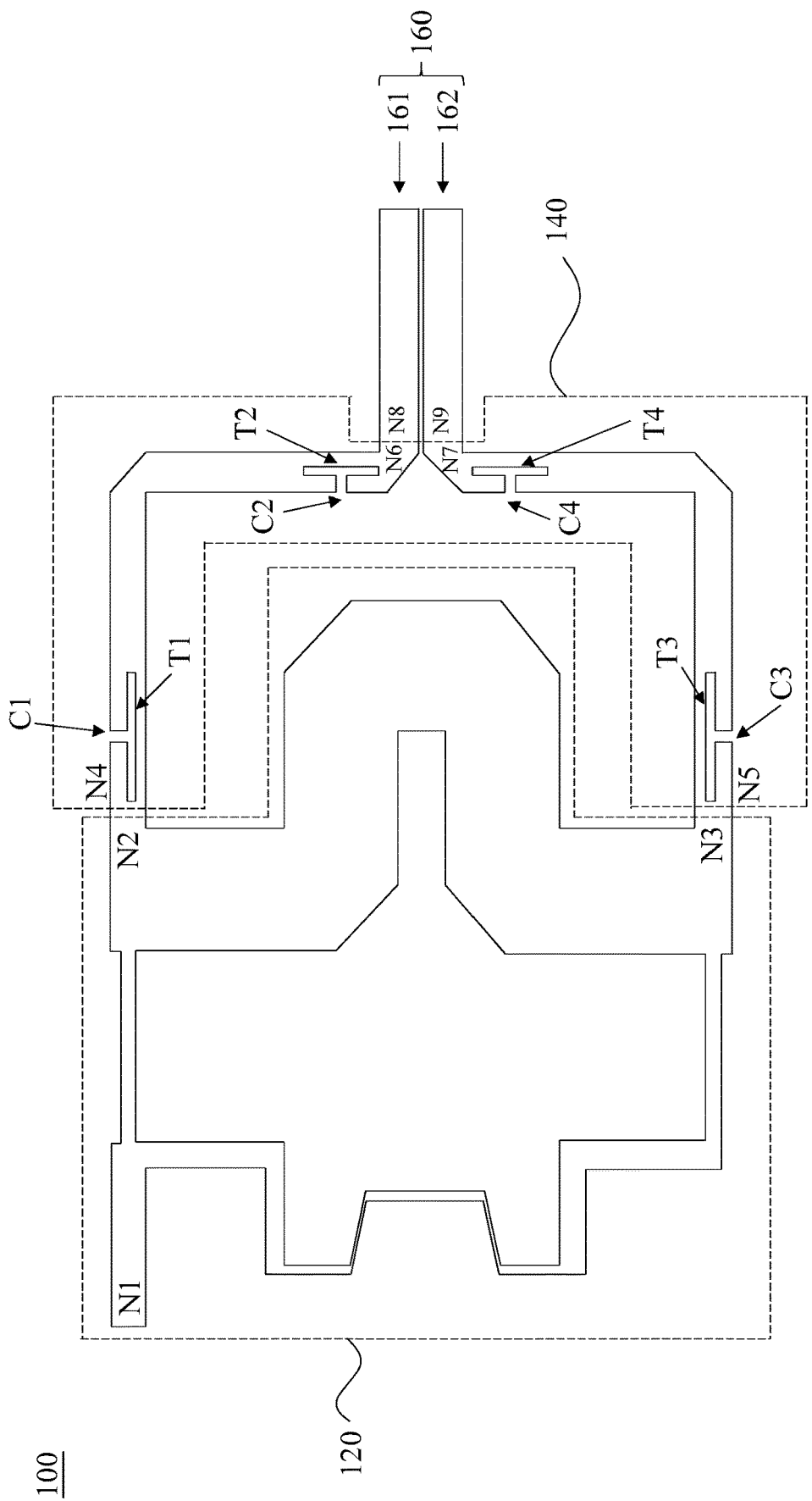
FIG. 2 is a schematic diagram illustrating the first conductive layer of the dual-band transform circuit structure in certain embodiments of the present disclosure.
Figure 3:
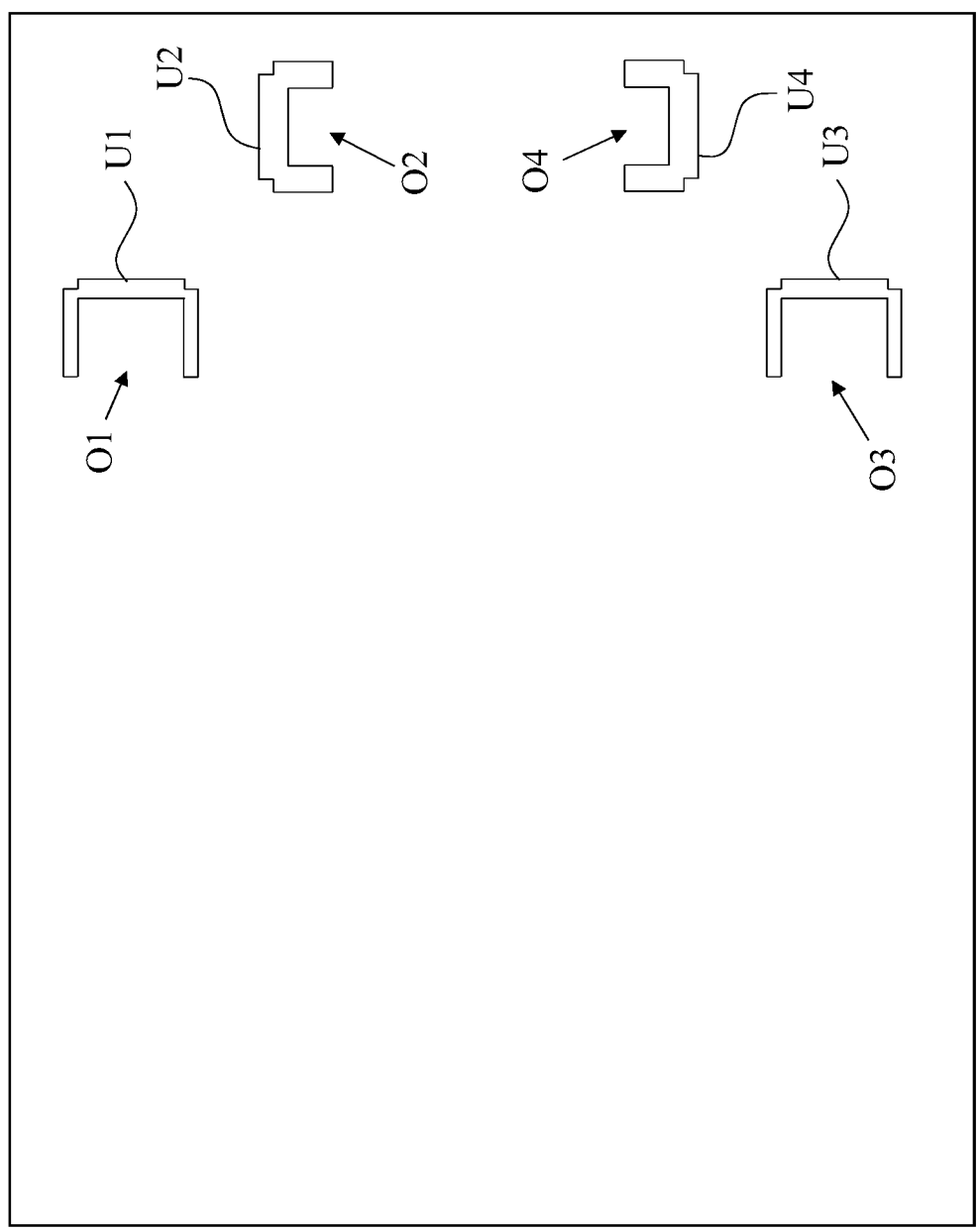
FIG. 3 is a schematic diagram illustrating the second conductive layer of the dual-band transform circuit structure in certain embodiments of the present disclosure.

To facilitate understanding of the relative arrangement of the components of the conductive layer 100 and the conductive layer 200, FIG. 2 and FIG. 3 respectively illustrate schematic diagrams of the conductive layer 100 and the conductive layer 200.

Reference is made to FIG. 2. The transmission line 140 includes hollow patterns T1, T2, T3, and T4. As shown in FIG. 3, the conductive layer 200 includes a metal sheet having hollow patterns U1, U2, U3, and U4; as shown in FIG. 1, the hollow patterns U1-U4 partially overlap with the transmission line 140, but the hollow patterns U1-U4 does not overlap with the hollow patterns T1-T4 of the transmission line 140.

Figure 4:
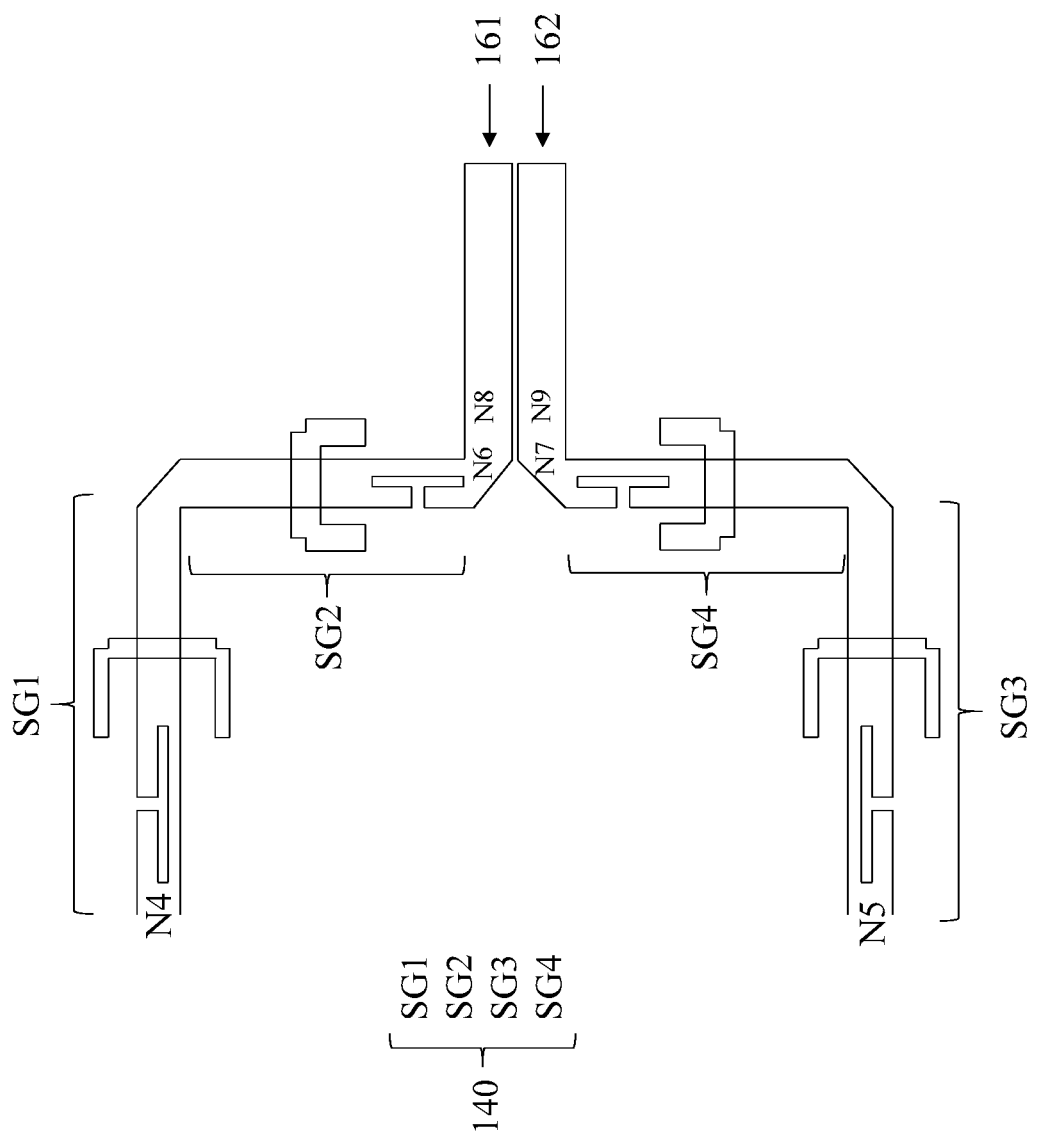
FIG. 4 is a detailed schematic diagram illustrating the partial dual-band transform circuit structure in certain embodiments of the present disclosure.

Reference is also made to FIG. 4. FIG. 4 is a schematic diagram illustrating the transmission line 140 and the hollow patterns U1-U4. The transmission line 140 includes a first segment SG1, a second segment SG2, a third segment SG3 and a fourth segment SG4. The first segment SG1 is connected between the input terminal N4 and the second segment SG2; the second segment SG2 is connected between the first segment SG1 and the output terminal N6; the third segment SG3 is connected between the input terminal N5 and the fourth segment SG4; and the fourth segment SG4 is connected between the third segment SG3 and the output terminal N7. In the top view, the first segment SG1, the third segment SG3, the first strip 161, and the second strip 162 are arranged in parallel, the second segment SG2 and the fourth segment SG4 are arranged in parallel, the first segment SG1 and the second segment SG2 are arranged perpendicular to each other, and the third segment SG3 and the fourth segment SG4 are arranged perpendicular to each other.

The hollow pattern T1 is arranged in the first segment SG1; the hollow pattern T2 is arranged in the second segment SG2; the hollow pattern T3 is arranged in the third segment SG3; and the hollow pattern T4 is arranged in the fourth segment SG4.

In the top view, the hollow patterns T1-T4 in the transmission line 140 are not closed hollow patterns, and the hollow patterns T1-T4 are T-shaped hollow patterns having a notch. A notch C1 of the hollow pattern T1 faces a direction away from the third segment SG3; a notch C2 in the hollow pattern T2 faces a direction away from the transmission line 160; a notch C3 in the hollow pattern T3 faces a direction away from the first segment SG1; and a notch C4 in the hollow pattern T4 faces a direction away from the transmission line 160. The first segment SG1, the hollow pattern T1, the second segment SG2, and the hollow pattern T2 are arranged symmetrically with respect to the third segment SG3, the hollow pattern T3, the fourth segment SG4, and the hollow pattern T4, respectively. In certain embodiments, the hollow pattern T1 and the hollow pattern T3 have the same size, and the hollow pattern T2 and the hollow pattern T4 have the same size. In certain embodiments, the hollow pattern T1 and the hollow pattern T2 have different sizes. In other embodiments, the direction of the notches C1-C4 in the hollow patterns T1~T4 may be different from that shown in FIG. 2.

In the top view, the hollow pattern U1 overlaps with the first segment SG1, the hollow pattern U2 overlaps with the first segment SG2, the hollow pattern U3 overlaps with the first segment SG3, and the hollow pattern U4 overlaps with the fourth segment SG4. The hollow patterns U1-U4 are closed hollow patterns and are U-shaped hollow patterns having an opening. The first segment SG1 passes through the opening O1 of the hollow pattern U1, and the opening O1 faces toward the input terminal N4; the second segment SG2 passes through the opening O2 of the hollow pattern U2, and the opening O2 faces toward the output terminal N6; the third segment SG3 passes through the opening O3 of the hollow pattern U3, and the opening O3 faces toward the input terminal N5; the fourth segment SG4 passes through the opening O4 of the hollow pattern U4, and the opening O4 faces toward the output terminal N7. In certain embodiments, the hollow pattern U1 and the hollow pattern U3 have the same size, and the hollow pattern U2 and the hollow pattern U4 have the same size. In certain embodiments, the hollow pattern U1 and the hollow pattern U2 have different sizes.

In certain embodiments, the dual-band transform circuit structure 10 is configured to suppress the high-order harmonics of the input signal. In other words, the dual-band transform circuit structure 10 is configured to increase the insertion loss at high-frequency. For example, when the dual-band transform circuit structure 10 is configured to transmit the signal of 2.4 GHz and/or 5.5 GHz, the high-order harmonics of the signal may range in 10~18 GHz (such as 16.5 GHz, which is the third harmonic of the 5.5 GHz signal), and the dual-band transform circuit structure 10 uses the hollow patterns in the transmission line 140 and the conductive layer 200 to increase a stopband bandwidth in 10~18 GHz. In certain embodiments, the dual-band transform circuit structure 10 provides an insertion loss of at least approximately 30 dB to signals in the bandwidth in 10~18 GHz.

In certain embodiments, the transmission line 140 and the hollow patterns U1-U4 are used as a low-pass filter, which can obtain frequency response thereof according to the elliptic equation, Butterworth filter formula or Chebyshev filter formula. The hollow pattern T1, the hollow pattern U1, the hollow pattern T2, and the hollow pattern U2 are sequentially connected in series along the first segment SG1 and the second segment SG2 to be a path, and the hollow pattern T3, the hollow pattern U3, the hollow pattern T4, and the hollow pattern U4 are sequentially connected in series along the third segment SG3 and the fourth segment SG4 to be another path. Said two paths are connected in parallel to form a low-pass filter, wherein each of the hollow patterns U1-U4 and the hollow patterns T1-T4 is considered to be a band-rejection filter, and each band-rejection filter contributes a transmission zero point to the low-pass filter. These band-rejection filters are connected in series to form the above-mentioned low-pass filter.

The stopband bandwidth of these band-rejection filters is related to the sizes and positions of the hollow patterns U1-U4 and the hollow patterns T1-T4. In certain embodiments, the smaller the size of the hollow patterns U1-U4 (such as the area of the hollow portion), the higher the frequency of the corresponding transmission zero point. In certain embodiments, the smaller the size of the hollow patterns T1-T4, the higher the frequency of the corresponding transmission zero point.

In other embodiments, the transmission line 140 does not include the hollow pattern T1 and the hollow pattern T3.

In other embodiments, the transmission line 140 does not include the hollow pattern T2 and the hollow pattern T4.

In other embodiments, the conductive layer 200 does not include the hollow pattern U1 and the hollow pattern U3.

In other embodiments, the conductive layer 200 does not include the hollow pattern U2 and the hollow pattern U4.

In certain embodiments, the first segment SG1 has at least two T-shaped, non-closed hollow patterns with different sizes, and the third segment SG3 has at least two T-shaped, non-closed hollow patterns with different sizes. In certain embodiments, the second segment SG2 has at least two T-shaped, non-closed hollow patterns with different sizes, and the fourth segment SG4 has at least two T-shaped, non-closed hollow patterns with different sizes. In some further embodiments, the T-shaped hollow patterns in the first segment SG1 and the second segment SG2 have different sizes from each other, and the T-shaped hollow patterns in the third segment SG3 and the fourth segment SG4 have different sizes from each other.

In certain embodiments, the conductive layer 200 further includes two identical U-shaped hollow patterns different from the hollow patterns U1, U2, wherein the two U-shaped hollow patterns respectively overlap with the first segment SG1 and the third segment SG3. In certain embodiments, the conductive layer 200 further includes two identical U-shaped hollow patterns different from the hollow pattern U3, U4, wherein the two U-shaped hollow patterns respectively overlap with the second segment SG2 and the fourth segment SG4. In some further embodiments, the U-shaped hollow patterns overlapping with the first segment SG1 and the second segment SG2 have different sizes, and the U-shaped hollow patterns overlapping with the third segment SG3 and the fourth segment SG4 have different sizes.

What is claimed is:

1. A dual-band transform circuit structure comprising:
   a first transmission line having a first input terminal, a first output terminal, and a second output terminal;
   a second transmission line having a second input terminal, a third input terminal, a third output terminal, and a fourth output terminal, the second input terminal being coupled to the first output terminal and the third input terminal being coupled to the second output terminal, and
   a conductive layer stacked with the first transmission line and the second transmission line comprising:
      a first hollow pattern that is overlapped in a top view with the second transmission line.

2. The dual-band transform circuit structure of claim 1, wherein the second transmission line comprises a second hollow pattern, wherein the second hollow pattern and the first hollow pattern are not overlapped in the top view.

3. The dual-band transform circuit structure of claim 2, wherein the conductive layer further comprises a third hollow pattern, wherein the third hollow pattern and the second transmission line are overlapped in the top view, and the third hollow pattern is separated from the first hollow pattern, wherein the first hollow pattern and the third hollow pattern are U-shaped patterns.

4. The dual-band transform circuit structure of claim 3, wherein the second transmission line further comprises a fourth hollow pattern, wherein the first hollow pattern, the second hollow pattern, the third hollow pattern and the fourth hollow pattern are not overlapped in the top view.

5. The dual-band transform circuit structure of claim 4, wherein the second hollow pattern and the fourth hollow pattern are T-shaped patterns, and are not closed hollow patterns.

6. The dual-band transform circuit structure of claim 5, wherein the second transmission line comprises:
   a first segment connected to the second input terminal;
   a second segment perpendicular to the first segment and connecting the first segment to the third output terminal;
   a third segment connected to the third input terminal; and
   a fourth segment perpendicular to the third segment and connecting the third segment to the fourth output terminal.

7. The dual-band transform circuit structure of claim 6, wherein the first hollow pattern and the first segment are overlapped in the top view, the third hollow pattern and the second segment are overlapped in the top view, the second hollow pattern is disposed in the first segment, and the fourth hollow pattern is disposed in the second segment.

8. The dual-band transform circuit structure of claim 6, wherein the conductive layer further comprises a fifth hollow pattern, and the second transmission line further comprises a sixth hollow pattern disposed in the third segment,
   wherein the fifth hollow pattern and the third segment are overlapped in the top view, and are not overlapped with the sixth hollow pattern in the top view.

9. The dual-band transform circuit structure of claim 6, wherein the conductive layer further comprises a seventh hollow pattern, and the second transmission line further comprises an eighth hollow pattern disposed in the fourth segment,
   wherein the seventh hollow pattern and the fourth segment are overlapped in the top view, and are not overlapped with the eighth hollow pattern in the top view.

10. The dual-band transform circuit structure of claim 1, wherein the conductive layer is electrically connected to the ground, wherein the dual-band transform circuit structure further comprises:
    a third transmission line, comprising:
       a first strip having a fourth input terminal, wherein the fourth input terminal is coupled to the third output terminal, and the first strip extends in a direction away from the second transmission line; and
       a second strip having a fifth input terminal, wherein the fifth input terminal is coupled to the fourth output terminal, and the second strip extends along the direction.

11. A dual-band transform circuit structure, comprising:
    a first conductive layer; and
    a second conductive layer comprising a first hollow pattern, wherein the second conductive layer and the first conductive layer are stacked and separated by a dielectric material,
    wherein the first conductive layer comprises:
       a balun circuit;
       a filter circuit comprising a transmission line, wherein the transmission line comprises a second hollow pattern, wherein the first hollow pattern and the transmission line are overlapped in a top view, and the first hollow pattern is not overlapped with the second hollow pattern in the top view; and
       a coplanar strip, wherein the filter circuit is coupled between the balun circuit and the coplanar strip.

12. The dual-band transform circuit structure of claim 11, wherein the second conductive layer further comprises a third hollow pattern, and the transmission line further comprises a fourth hollow pattern, wherein the third hollow pattern and the transmission line are overlapped in the top view, and the first hollow pattern, the second hollow pattern, the third hollow pattern and the fourth hollow pattern are not overlapped with each other in the top view.

13. The dual-band transform circuit structure of claim 12, wherein the transmission line has a first segment, a second segment, a third segment and a fourth segment, wherein the first segment is parallel to the third segment, the second segment is parallel to the fourth segment, and the first segment is perpendicular to the second segment, wherein the first hollow pattern and the first segment are overlapped in the top view, and the second hollow pattern is disposed in the first segment.

14. The dual-band transform circuit structure of claim 13, wherein the filter circuit has a first input terminal, a second input terminal, a first output terminal and a second output terminal, wherein the first input terminal and the second input terminal are configured to connect to the balun circuit, and the first output terminal and the second output terminal are configured to connect the coplanar strip, wherein the first segment and the third segment are respectively configured to connect to the first input terminal and the second input terminal, the second segment is configured to couple the first segment to the first output terminal, and the fourth segment is configured to couple the third segment to the second output terminal.

15. The dual-band transform circuit structure of claim 14, wherein the second conductive layer further comprises a fifth hollow pattern and a seventh hollow pattern, and the transmission line further comprises a sixth hollow pattern and an eighth hollow pattern, wherein the fifth hollow pattern and the third segment are overlapped in the top view, the seventh hollow pattern and the fourth segment are overlapped in the top view, and the fifth hollow pattern, the sixth hollow pattern, the seventh hollow pattern and the eighth hollow pattern are not overlapped with each other in the top view.

16. The dual-band transform circuit structure of claim 13, wherein the first hollow pattern is a U-shaped pattern having an opening.

17. The dual-band transform circuit structure of claim 16, wherein the first segment passes through the opening of the first hollow pattern in the top view.

18. The dual-band transform circuit structure of claim 11, wherein the second conductive layer is electrically connected to the ground.

19. The dual-band transform circuit structure of claim 11, wherein the second hollow pattern is a T-shaped pattern.

20. The dual-band transform circuit structure of claim 19, wherein the second hollow pattern is not a closed hollow pattern.

* * * * *